United States Patent
Ferrant

(10) Patent No.: US 6,205,077 B1
(45) Date of Patent: Mar. 20, 2001

(54) ONE-TIME PROGRAMMABLE LOGIC CELL

(75) Inventor: Richard Ferrant, Crolles (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/575,716

(22) Filed: Jul. 28, 2000

(30) Foreign Application Priority Data

Jul. 30, 1999 (FR) .................................................. 99 10090

(51) Int. Cl.$^7$ ................................................ G11C 7/00
(52) U.S. Cl. ...................................... 365/225.7; 327/525
(58) Field of Search ........................... 365/225.7, 189.01; 327/525

(56) References Cited

U.S. PATENT DOCUMENTS

| 4,486,671 | 12/1984 | Ong ........................................ 307/264 |
| 4,621,346 | 11/1986 | McAdams ............................. 365/227 |
| 5,173,616 | * 12/1992 | Hinooka ................................ 327/525 |
| 5,457,656 | * 10/1995 | Fu ........................................ 365/200 |
| 5,566,107 | * 10/1996 | Gilliam ................................ 365/200 |
| 5,838,625 | 11/1998 | Cutter et al. ....................... 365/225.7 |

FOREIGN PATENT DOCUMENTS

| 0 480 475 | 4/1992 | (EP) . |
| 60-249423 | 12/1985 | (JP) . |

\* cited by examiner

*Primary Examiner*—David Nelms
*Assistant Examiner*—Hoai V. Ho
(74) *Attorney, Agent, or Firm*—Theodore E. Galanthay; E. Russell Tarleton; Seed IP Law Group PLLC

(57) ABSTRACT

A one-time programmable cell including an inverter providing a logic state according to the state of the cell; a fuse coupled between a first supply voltage and the inverter input; and a current source coupled between the fuse and a second supply voltage. The inverter is supplied from the second supply voltage through a first diode-connected transistor and the current source is formed of a second transistor controlled by the inverter output, this second transistor having a threshold voltage greater than that of the first transistor.

17 Claims, 1 Drawing Sheet

ONE-TIME PROGRAMMABLE LOGIC CELL

TECHNICAL FIELD

The present invention relates to a fuse in CMOS technology, and more specifically to a one-time programmable (OTP) cell for providing a logic state according to the state of the fuse.

BACKGROUND OF INVENTION

FIG. 1 shows a conventional example of an OTP cell. It includes a fuse 10 connected between a programming terminal 12 and a node A. Node A is connected to high supply voltage Vdd by a current source 14. The input of an inverter 16 is connected to node A, and output S of this inverter provides a logic state corresponding to the state of fuse 10.

Further, node A is connected to low supply voltage Vss by a reset transistor MN1.

In normal operation, programming terminal 12 is connected to low supply voltage Vss. Upon circuit power-on, reset transistor MN1 receives a reset pulse INIT on its gate. Transistor MN1 is thus turned on for a short time to bring the voltage of node A to voltage Vss. After the reset pulse, transistor MN1 is off. If fuse 10 is conductive, it maintains node A to voltage Vss and inverter 16 provides logic state 1. If fuse 10 is off, current source 14 draws node A to voltage Vdd and inverter 16 then provides logic state 0.

Fuse 10 is often formed of the oxide layer separating the substrate from the gate of a MOS transistor. A P-channel MOS transistor having an interconnected drain, well and source is generally used. Thus, the unprogrammed fuse is isolating. To program the fuse, the oxide layer is broken down, to then become conductive. For this purpose, a programming voltage Vpp much greater than supply voltage Vdd is applied between the two surfaces of the oxide layer. In the cell of FIG. 1, voltage Vpp is applied on programming terminal 12 while transistor MN1 is turned on.

Programming terminal 12 is generally external to the circuit, since voltage Vpp would risk damaging the circuit components if it were transmitted internally. The short-circuit of node A to voltage Vss through transistor MN1 prevents a possible increase of the voltage on node A under the effect of programming voltage Vpp.

A disadvantage of the cell of FIG. 1 is that a current source 14 that permanently provides current when the corresponding fuse 10 is conductive is required for each fuse 10. This discourages the use of OTP cells in applications where a small consumption is desired.

SUMMARY OF INVENTION

The disclosed embodiments of the present invention provide an OTP cell having a negligible current consumption. To achieve this, the embodiments of present invention provide a one-time programmable cell including an inverter providing a logic state according to the state of the cell; a fuse coupled between a first supply voltage and the inverter input; and a current source coupled between the fuse and the second supply voltage. The inverter is supplied from the second supply voltage through a first diode-connected transistor and the current source is formed of a second transistor controlled by the inverter output, this second transistor having a threshold voltage greater than that of the first transistor. According to an embodiment of the present invention, the first and second transistors are P-channel MOS transistors, the second supply voltage being a high voltage. According to an embodiment of the present invention, the channel length of the second transistor is greater than that of the first transistor. According to an embodiment of the present invention, the cell includes a reset transistor connecting the connection node between the fuse and the second transistor to the first supply voltage. The foregoing objects, features and advantages of the present invention, will be discussed in detail in the following non-limiting description of specific embodiments in connection with the accompanying drawings.

DETAILED DESCRIPTION

Figure 1:
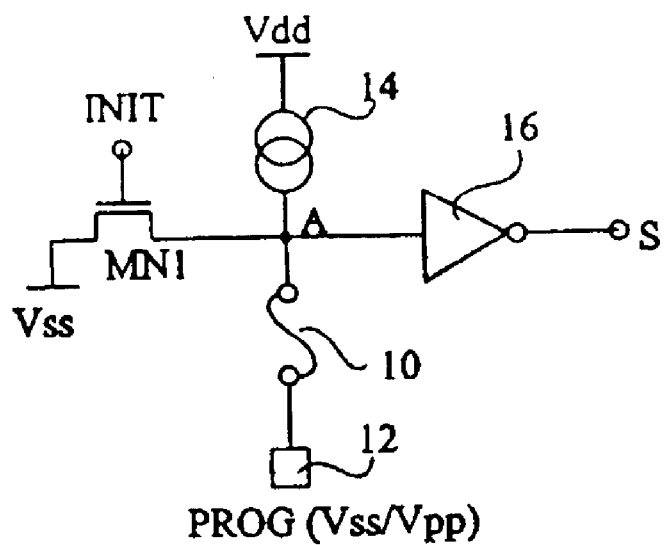
FIG. 1, previously described, shows an example of a conventional OTP cell.
Figure 2:
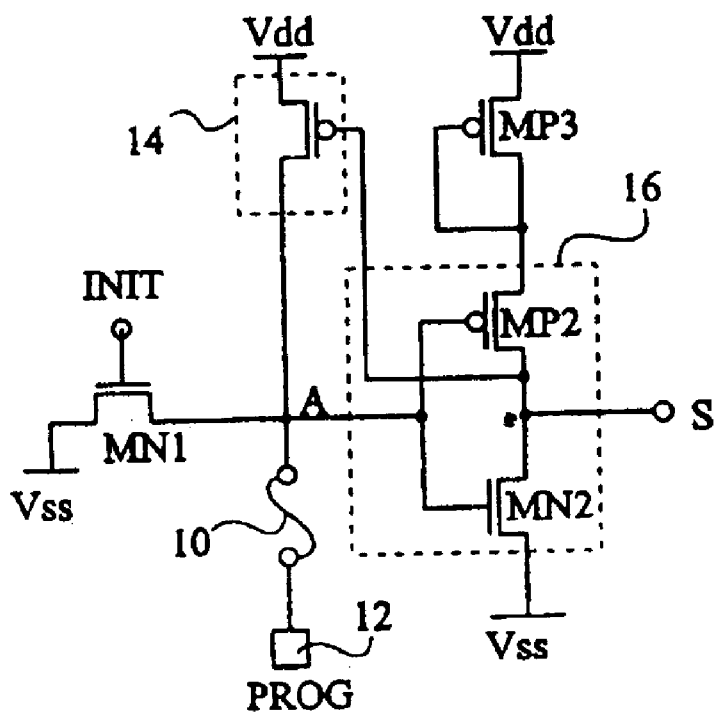
FIG. 2 shows an embodiment of a low consumption OTP cell according to the present invention.

For convenience, in FIG. 2 the same elements as FIG. 1 are designated by same reference numbers. Current source 14 and inverter 16 are shown in more detail. Current source 14 includes a P-channel MOS transistor, the source of which is connected to high supply voltage Vdd, and the drain of which is connected to node A. Inverter 16 includes an N-channel MOS transistor MN2 and a P-channel MOS transistor MP2 connected in series. The drains of transistors MP2 and MN2 are interconnected and form output S of the inverter. The gates of these transistors are interconnected and form input A of the inverter. The source of transistor MN2 conventionally receives low supply voltage Vss.

According to this embodiment of the present invention, the source of transistor MP2 is connected to high supply voltage Vdd via a diode-connected P-channel MOS transistor MP3. In other words, the source of transistor MP3 is connected to high voltage Vdd while the gate and drain of this transistor are connected to the source of transistor MP2.

Further, also according to this embodiment of the present invention, the gate of the transistor forming current source 14 is connected to output S of the inverter. Transistor 14 is formed to have a threshold voltage slightly greater than that of transistor MP3. For this purpose, for example, the channel length of transistor 14 is greater than that of transistor MP3.

Upon power-on, transistor MN1 is, as in the conventional circuit of FIG. 1, briefly turned on. Node A is thus brought to voltage Vss. Transistor MP2 is then on while transistor MN2 is off. Transistor MP2 applies on output S of the inverter the voltage present at its source, which is equal to Vdd-VT3, where VT3 is the threshold voltage of transistor MP3. This voltage level is considered as being logic level 1.

Voltage Vdd-VT3 is applied to the gate of transistor 14, which means that the source-gate voltage of transistor 14 is equal to VT3. For transistor 14 to be fully conductive, its source-gate voltage must be greater than its threshold voltage VT14. Now, as previously indicated, threshold voltage VT3 of transistor MP3 is smaller than that of transistor 14. As a result, transistor 14 is on the borderline of conduction and lets through a leakage current that is all the smaller as threshold VT14 of this transistor is chosen to be large as compared to threshold voltage VT3.

Accordingly, when node A is at a low voltage, transistor 14 provides a negligible current.

When transistor MN1 is off for normal operation, and if fuse 10 has been programmed (that is, if it is conductive), node A remains at low voltage Vss and the circuit state remains unchanged, that is, with a negligible current consumption.

If fuse 10 is not programmed, that is, if it is off, the small current flowing through transistor 14, provided that it is greater than the leakage current of transistor MN1, tends to draw the voltage of node A to voltage Vdd. Thus, the voltage of node A starts slowly increasing from value 0. When it reaches the threshold voltage of transistor MN2, transistor MN2 turns on and tends to draw node S to low voltage Vss antagonistically with transistor MP2. Since the voltage on output S lowers, transistor 14 becomes more conductive and tends to bring node A faster to voltage Vdd. When the voltage of node A reaches high voltage Vdd, transistor MN2 is fully conductive and maintains output S of the inverter at low voltage Vss, that is, at logic level 0, while transistor MP2 is off.

With a cell according to this embodiment of the present invention, when fuse 10 is conductive, a static current consumption equal to the leakage current of transistor 14 is obtained. To further decrease the static current consumption, it may be envisaged to decrease the leakage of transistor 14 by further increasing its threshold voltage. However, as previously indicated, the leakage of transistor 14 must be greater than that of transistor MN1.

Further, if the leakage current of transistor 14 is excessively decreased, the level on node A may take too long to reach voltage Vdd upon power-on when fuse 10 is open. Good results are obtained, for example, by choosing a channel length of 2 or 3 units for transistor 14 and of one unit for transistor MP3.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A one-time programmable cell, comprising: an inverter providing a logic state according to the state of the cell; a fuse coupled between a first supply voltage and the inverter input; and a current source coupled between the fuse and a second supply voltage, the second supply voltage supplying the inverter through a first diode-connected transistor, and the current source is formed of a second transistor controlled by the inverter output, the second transistor having a threshold voltage greater than a threshold voltage of the first transistor.

2. The one-time programmable cell of claim 1 wherein the first and second transistors are P-channel MOS transistors, and the second supply voltage has a greater voltage than the first supply voltage.

3. The one-time programmable cell of claim 1 wherein the second transistor has a channel length greater than a channel length of the first transistor.

4. The one-time programmable cell of claim 1, further comprising a reset transistor connecting a connection node between the fuse and the second transistor to the first supply voltage.

5. A one-time programmable cell, comprising: a fuse element having a first terminal coupled to a first supply voltage and a second terminal connected to a connection node; an inverter having an input coupled to the connection node, a first supply terminal coupled to a reference voltage, and further having a second supply terminal and an output terminal; a first transistor having a first terminal coupled to the connection node, a second terminal coupled to a second supply voltage, and a control terminal coupled to the output of the inverter; and a second transistor having a first terminal coupled to the second supply voltage, a second terminal coupled to the second supply terminal of the inverter and further connected to a control terminal of the second transistor, the second transistor configured to have a threshold voltage greater than a threshold voltage of the first transistor.

6. The one-time programmable cell of claim 5 wherein the second transistor is configured to have a channel length greater than a channel length of the first transistor.

7. The one-time programmable cell of claim 5 wherein the first and second transistors are P-channel MOS transistors.

8. The one-time programmable cell of claim 5, further comprising a third transistor having a first terminal connected to the first supply voltage, a second terminal connected to the connection node, and a control terminal coupled to a control signal source.

9. The one-time programmable cell of claim 8 wherein the first terminal of the fuse element is coupled to the first supply voltage through a programming terminal.

10. The one-time programmable cell of claim 5 wherein the fuse element comprises an oxide layer formed on a semiconductor substrate.

11. A cell for providing a logic state according to the state of a fuse element, the cell comprising: a fuse element having a first terminal coupled to a low supply voltage, and a second terminal; a first transistor having a first terminal coupled to a high supply voltage, a second terminal coupled to the second terminal of the fuse element, and a control terminal; an inverter having an input terminal coupled to the second terminal of the first transistor and to the second terminal of the fuse element, an output terminal coupled to the control terminal of the first transistor, a first supply terminal coupled to the low voltage supply and a high supply terminal; a second transistor having a first terminal coupled to the high supply voltage, a second terminal coupled to the high supply terminal of the inverter, and a diode connected control terminal; and a third transistor having a first terminal coupled to the low supply voltage, a second terminal coupled to the input terminal of the inverter, and a control terminal coupled to a control signal source.

12. The cell of claim 11 wherein the second transistor is formed to have a threshold voltage greater than a threshold voltage of the first transistor.

13. The cell of claim 11 wherein the second transistor has a channel length greater than a channel length of the first transistor.

14. The cell of claim 11 wherein the first and second transistors comprise P-channel MOS transistors, with the second transistor having a channel length greater than a channel length of the first transistor such that a threshold voltage of the second transistor is greater than a threshold voltage of the first transistor.

15. The cell of claim 11 wherein the fuse element comprises a P-channel MOS transistor having an interconnected drain, well, and source.

16. The cell of claim 15 wherein the fuse element further comprises an oxide layer separating a semiconductor substrate from a gate of the P-channel MOS transistor.

17. The cell of claim 16 wherein the oxide layer is structured to break down and become conductive when subjected to a programming voltage that is greater than the high supply voltage.

* * * * *